United States Patent
Martinis

(10) Patent No.: US 10,998,486 B1
(45) Date of Patent: May 4, 2021

(54) REDUCING QUBIT ENERGY DECAY AND CORRELATED ERRORS FROM COSMIC RAYS IN QUANTUM PROCESSORS

(71) Applicant: Quantala LLC, Santa Barbara, CA (US)

(72) Inventor: John M. Martinis, Santa Barbara, CA (US)

(73) Assignee: Quantala LLC, Santa Barbara, CA (US)

( * ) Notice: Subject to any disclaimer, the term of this patent is extended or adjusted under 35 U.S.C. 154(b) by 0 days.

(21) Appl. No.: 17/094,482

(22) Filed: Nov. 10, 2020

(51) Int. Cl.
| | |
|---|---|
| *H01L 39/22* | (2006.01) |
| *G06N 10/00* | (2019.01) |
| *H01L 27/18* | (2006.01) |
| *H01L 39/24* | (2006.01) |
| *H01L 39/02* | (2006.01) |

(52) U.S. Cl.
CPC ............ *H01L 39/223* (2013.01); *G06N 10/00* (2019.01); *H01L 27/18* (2013.01); *H01L 39/025* (2013.01); *H01L 39/22* (2013.01); *H01L 39/24* (2013.01)

(58) Field of Classification Search
CPC ..... H01L 39/223; H01L 39/025; H01L 39/22; H01L 39/2493; H01L 39/24; H01L 27/18; G06N 10/00
See application file for complete search history.

(56) References Cited

U.S. PATENT DOCUMENTS

| | | | | |
|---|---|---|---|---|
| 5,869,846 | A * | 2/1999 | Higashino | H01L 39/225 257/31 |
| 6,979,836 | B2 * | 12/2005 | Zagoskin | B82Y 10/00 257/31 |
| 8,301,214 | B1 * | 10/2012 | Tolpygo | H01L 39/223 505/190 |
| 9,780,285 | B1 * | 10/2017 | Kirby | H01L 39/223 |
| 2003/0102777 | A1 * | 6/2003 | Kuniyasu | B06B 1/0629 310/334 |
| 2004/0223380 | A1 * | 11/2004 | Hato | H01L 27/18 365/200 |

(Continued)

OTHER PUBLICATIONS

Irwin, K.D. et al., "X-ray detection using a superconducting transition-edge sensor microcalorimeter with electrothermal feedback," Applied Physics Letters, vol. 69, Iss. 13, Sep. 1996, pp. 1945-1947.

(Continued)

*Primary Examiner* — Kyoung Lee
*Assistant Examiner* — Christina A Sylvia
(74) *Attorney, Agent, or Firm* — Fenwick & West LLP

(57) ABSTRACT

Large algorithms can be run on a quantum computer only if quantum error correction is used to lower logical qubit errors. The energy deposited by cosmic-ray muons produces a quasiparticle "heat" pulse that causes the qubits to decay in energy quickly, with errors correlated in space and time, so that error correction fails. Metal layers comprising normal metal and/or small-gap superconductors channel this energy away from the qubit into benign structures so that qubit performance is not degraded. These structures are designed according to the electron-phonon interactions and constraints from electromagnetic radiation to make large reductions in the induced errors so that error correction works properly.

20 Claims, 5 Drawing Sheets

(56) References Cited

U.S. PATENT DOCUMENTS

2012/0161125 A1* 6/2012 Yamazaki ......... H01L 29/78618
257/43

OTHER PUBLICATIONS

Karatsu, K. et al., "Mitigation of cosmic ray effect on microwave kinetic inductance detector arrays," Applied Physics Letters, vol. 114, Iss. 3, Jan. 25, 2019, pp. 1-5.

Vepsäläinen, A. et al., "Impact of ionizing radiation on superconducting qubit coherence," Nature, vol. 584, Aug. 26, 2020, pp. 551-556.

* cited by examiner

REDUCING QUBIT ENERGY DECAY AND CORRELATED ERRORS FROM COSMIC RAYS IN QUANTUM PROCESSORS

BACKGROUND

This invention relates generally to quantum computing, and more particularly to reducing qubit energy decay and correlated errors from cosmic rays in quantum processors.

Quantum computers perform calculations that cannot be run by classical supercomputers, such as efficient prime factorization or solving how molecules bind using quantum chemistry. Such difficult problems can only be solved by embedding the algorithm in a large quantum computer that is running quantum error correction. However, error correction fails when physical quantum bit (qubit) errors are large or correlated.

Quantum computers have intrinsic errors, so algorithms can be natively run with typically only a few hundred to thousand logic operations. To run the most powerful and useful algorithms (e.g., with millions to billions of logic gates), errors should be reduced to a parts per million or billion range, or lower. Fortunately, this is possible using quantum error correction. The basic idea is to redundantly encode the qubit state in many physical qubits, in a way similar to classical error correction, so that errors in the physical qubit states can be selectively measured, decoded and corrected. For example, the surface code error correction scheme encodes a protected "logical" state with about 1000 physical qubits. If physical errors are small (about 0.1%) and occur randomly and independently among these 1000 qubits, then the logical error can be less than 0.1 part per billion. But if errors are large or correlated, occurring in bunches either together in time or together across the chip in space, then error correction fails. When the logical errors are large, the memory of the quantum computer is lost, and the algorithm fails.

Cosmic rays are a radiation source that produce large and correlated errors in the quantum chip. Cosmic rays naturally occur from high energy particles impinging from space to the atmosphere, where they are converted into muon particles that deeply penetrate all matter on the surface of the earth. When the muons go through the quantum chip, they deposit a large amount of energy in the substrate of the quantum processor (about 200 keV), which then briefly "heats" the chip. In presently designed chips, the qubits then have a short memory time (about 1-10% of normal memory time), both in space (across the entire chip) and for a long time duration (about 10 ms). The qubit errors during this event are thus so large and correlated that error correction stops working and the stored logical qubit state is destroyed. Cosmic ray muons impinge on the quantum chip every few seconds and thus will render inoperable any reasonably powerful algorithm running on the quantum computer.

For normal electronic devices, the effect of cosmic rays and other radiation is well known. In such electronic devices, the radiation creates charge carriers that move through the device and changes its electrical properties, creating both temporary (pulsed) and permanent changes. In quantum electronic devices, however, a different effect of cosmic rays comes from the "heat pulse" of the phonon energy after the energy is deposited. Because the operating principle of qubits—specifically superconducting qubits—differs from normal electronic devices, the mitigation strategy from this energy pulse has to be solved in a different way.

Although it is possible to operate a quantum computer deep underground, as has been done for some physics experiments, this is not a good commercial solution. In addition, there is always natural background radiation (from decay of heavy elements like Uranium) that produces similar energy events, depositing energy into the chip and destroying the qubit state. Redesign of the quantum chip is thus needed to channel (redirect) the deposited energy from the qubit components to benign structures.

SUMMARY

Embodiments of the invention comprise a design that reduces or eliminates the effect of cosmic rays on an array of superconducting devices so that error correction in these devices may continue to work properly even when experiencing cosmic rays. To achieve this, embodiments of the invention include methods to channel the deposited energy of the muon to other metallic structures in the quantum processor, away from the qubits that are degraded by the energy. For example, metal islands such as copper are placed on the backside of the quantum chip, so that the deposited energy is distributed between the quantum device and the normal metal (i.e., a metal that is not a superconductor). If the normal metal has significantly more volume than the quantum device, then the deposited energy going into the quantum device is significantly reduced by roughly the volume ratio. This method reduces the magnitude of the deposited energy and lessens qubit errors.

Additionally, any remaining energy in the qubit superconductor can remain there a long time, correlating errors (e.g., bunching errors together in time) and thus degrading error correction. Embodiments of the invention include methods to connect the leads of the qubit Josephson junction, the most sensitive component, to a superconductor of lower gap or a normal metal, so that this energy is quickly drawn away from the quantum device. This reduces the magnitude of the energy pulse and shortens the time duration the energy can affect the quantum device, which allows error correction to continue working.

Although embodiments of the invention are described in connection with superconducting quantum devices, the idea of channeling away energy from the qubit to other benign metal structures can also lessen the effect of cosmic ray muons to all quantum devices operating at low temperatures, such as spin, Majoranna, photon, and ion-trap qubits.

Figure 1:
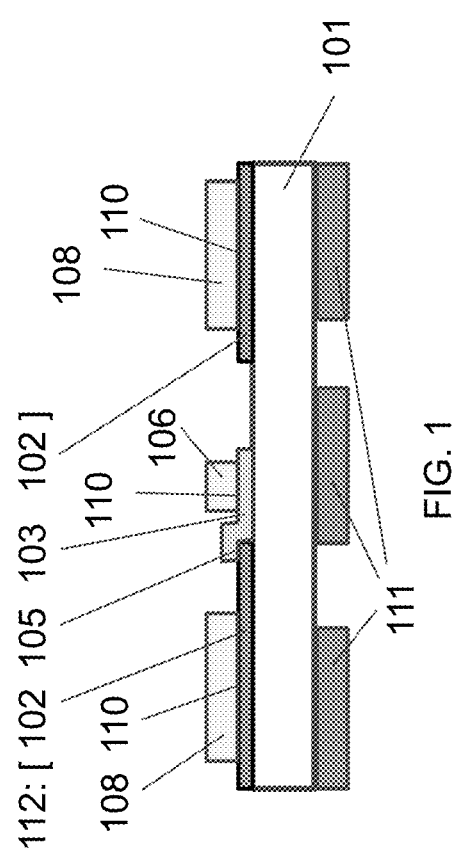
FIG. 1 is a cross-section representation of a quantum processor with channel structures to mitigate qubit decay from energy coming from a cosmic ray muon, according to an embodiment of the invention.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

A quantum processor, without any structures to mitigate energy coming from a cosmic-ray muon, typically uses a silicon or sapphire substrate with metal wiring typically made from aluminum. A Josephson tunnel junction is made from crossing two thin aluminum wires, with the bottom one oxidized to form a tunnel barrier. The Josephson junction forms a non-linear inductor, which in combination with capacitors form a non-linear microwave resonator that produces the quantum bit states. The chip is typically connected via aluminum wire bonds to a printed circuit board, which is then wired to external control and measurement electronics.

When a cosmic ray muon traverses through the substrate, it deposits about 200 keV of energy into the approximately 400 micrometer thick substrate. Around the traversal path this energy is converted into lattice vibrations, called phonons. Initially, it is possible for a high energy phonon (above about 100 Kelvin, close to the Debye energy) to be downconverted into two lower-energy phonons, but this is rapidly turned off as the phonons lower their energy to about 10-20 Kelvin because the energy-momentum dispersion relation then becomes linear. These phonons travel ballistically through the chip, but eventually move diffusively from random-direction reflection off of surfaces.

When the phonons travel through the aluminum wiring, either in the Josephson junction or leads, both about 50-200 nm in thickness, they can convert into two superconducting quasiparticles:

$$ph \rightarrow qp+qp,$$

which are elementary excitations of the superconductor. They are similar to electron excitations in metal but having an energy above that of the superconducting gap, which is typically 1.76 times the superconducting transition energy (about 2 Kelvin for aluminum). The phonon energy has to be greater than two times the superconducting gap for this conversion process to occur. Quasiparticles in the superconductor can relax their energy by the emission of a phonon:

$$qp \rightarrow qp+ph,$$

but the final quasiparticle energy still has to be greater than the superconducting gap. As obtained from numerical simulations, the net result of this cascade of the above phonon and quasiparticle decay events is that the energy of the muon goes into creating quasiparticles in the aluminum wires and Josephson junctions, with about 60% of the original energy converted into quasiparticles with an energy slightly above the superconducting gap.

These quasiparticles diffuse throughout the aluminum wiring and Josephson junction of the processor. Because quasiparticles act independently, like electrons in a normal metal, they provide a dissipation channel of electrical energy because they can absorb energy from currents flowing in the metal. This is the "two-fluid" model of superconductivity, where the superconducting electrons allow flow of electricity without absorbing energy, whereas the quasiparticles can dissipate energy. Most of the dissipation from the quasiparticles come from the Josephson junction, since this tunnel junction has a much larger normal resistance (about 100 Ohms) than the wiring (about 10 milli-Ohms).

Calculations of the density of quasiparticles coming from the deposited muon energy, the superconducting gap, and volume of metal gives a reduction of the energy decay time of the qubit in the range of 0.1 to 1 microsecond. This is much shorter than the normal lifetime of the qubit, 10 to 200 microseconds, and thus will produce much larger errors in the qubits and the subsequent error correction process. The quasiparticles diffuse rapidly throughout the chip, both from phonons and the quasiparticles themselves, with a time constant of 10 to 100 microseconds. This produces decay errors effectively simultaneously across the entire chip, producing correlated errors in space.

Two quasiparticles can recombine and produce a phonon, the inverse of the process described above. The characteristic recombination time decreases with increasing quasiparticle density, and for the above computed density is about 100 microseconds, as confirmed by prior experiments. For prior designs of the processor, the phonons have no structures for it to lose its energy other than the aluminum wires, which as discussed previously will then again produce two quasiparticles. Thus, the quasiparticle excitations last for a long time. Their decay time, about 10 milliseconds, is set by another loss mechanism, phonons escaping through the wire bonds connecting the chip to the printed circuit board, which then acts as the thermal ground for the phonons. This phonon decay is slow and produces qubit errors over a time span that is much longer in duration than the typical error correction cycle of 1 microsecond, thereby producing correlated errors in time.

Since the bottleneck of the phonon loss is diffusion through the wire bonds, the diffusion process is faster if the wire bonds are made out of elemental aluminum, not an alloy of aluminum, which has larger phonon scattering.

FIG. 1 shows a schematic cross-section for a quantum processor with channeling structures to mitigate energy coming from a cosmic-ray muon away from the qubit. FIG. 1 depicts a single silicon chip substrate 101, but multiple chips may be stacked together vertically with connections such as indium bump-bonds. In such cases, each chip in the stack may have channeling structures as described herein.

Figure 2:
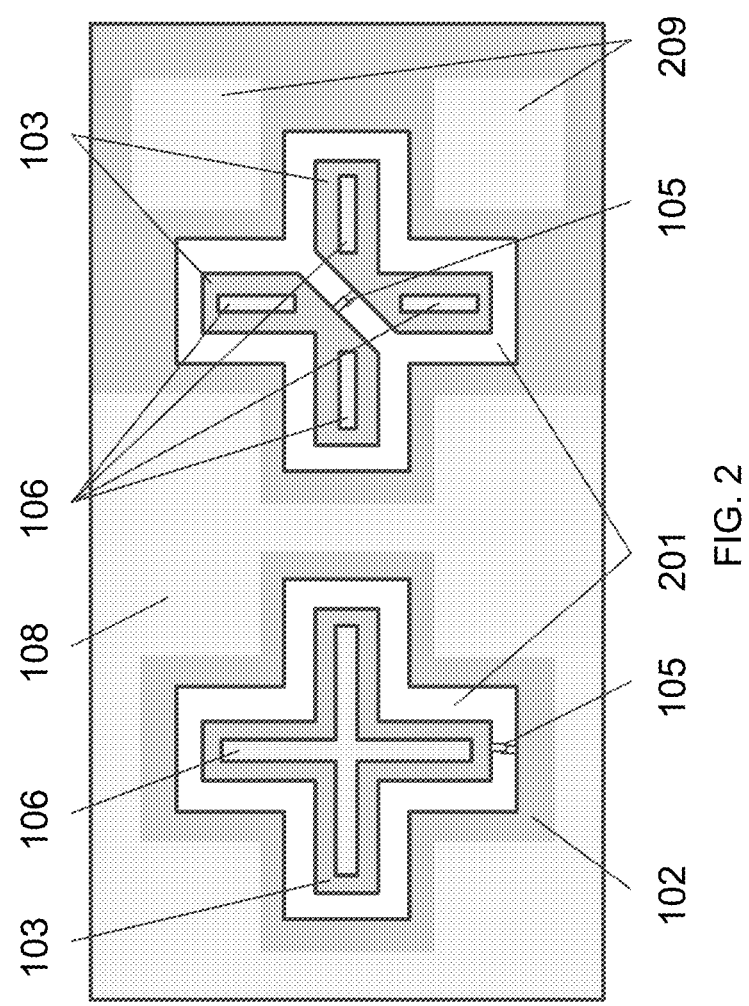
FIG. 2 is a top-view representation of the quantum processor of FIG. 1, which comprises with channel structures to mitigate qubit decay. The left cross structure is for a "single-ended" transmon, while the right structure is for a "differential" transmon.

FIG. 1 shows a qubit structure 112 that comprises aluminum ground plane 102 and lead 103 and a Josephson tunnel junction 105. FIG. 2 is a top view of the quantum processor of FIG. 1, showing designs at the left for a "single ended" qubit, with one lead of the Josephson junction 105 connected to the ground plane 102, or at the right for a "differential" qubit, with the leads of the Josephson junction 105 connected to two pads 103 isolated from the ground plane 102. The substrate 101 is not covered with metal in regions 201 of FIG. 2. In FIG. 1 a backside channel structure 111 (which may comprise a normal metal, such as copper) is included on the bottom side of the qubit structure, and also shown in the bottom view FIG. 3 as an array of square islands 111, where only one island is labeled. The backside channel structure 111 introduces a new scattering process:

$$ph \rightarrow ph+e,$$

which takes a phonon at high energy and generates a phonon and electron excitation at lower energy. With this scattering process, when the final phonon energy is lower than twice the superconducting gap, it can then no longer participate in the quasiparticle generation process in the superconductor of the qubit, as described previously. The net effect is to channel the energy from the muon into the backside channel structure 111 instead of the qubit.

As computed with numerical simulations, the energy from the cosmic ray muon is spread between the backside channel structure 111 and the qubit structure 112 composed of junction 105 and leads 102 and 103. The approximate fraction of the energy scales as the ratio of the relative heat capacities, which scales roughly as the relative volumes. For example, a typical 0.1 micrometer thick aluminum lead layer 102 and 103 and a backside 0.1 micrometer thick normal copper layer 111 would reduce the resulting density of quasiparticles in the aluminum by about a factor of 2. Increasing the copper layer 111 to 1 micrometer would reduce the quasiparticle density in the aluminum to about 10%, so that the energy decay time of the qubit would increase by about a factor of 10. To make a significant improvement in present devices, a thickness ratio of aluminum to copper of approximately 1:10 is needed. Even thicker copper layers, for example an aluminum to copper ratio of 1:100, would produce further improvements in the energy channeling and qubit decay times. For fabricating the backside channel structure 111, thin-film deposition techniques such as evaporation typically give a thickness less than one micrometer in thickness. To produce thicker films, copper can be plated electrolessly on the backside channel structure 111 to produce a large thickness of 1 to 100 micrometers, thus channeling even greater ratios of the muon energy away from the qubit device.

Figure 3:
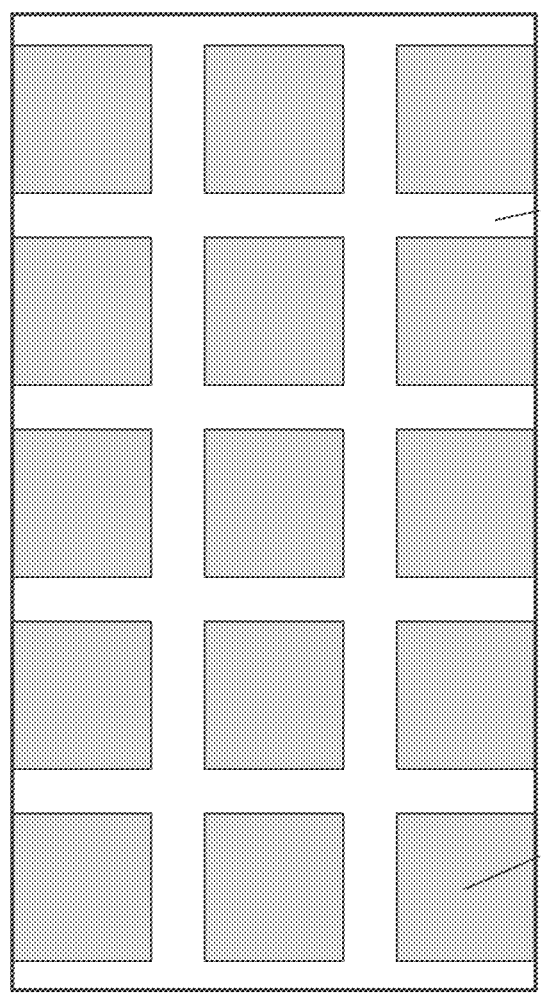
FIG. 3 is a bottom-view representation of the quantum processor of FIG. 1, which comprises channel structures to mitigate qubit decay.

FIG. 3 also shows that the backside channel structure 111 is separated into many disconnected islands, isolated by uncovered areas of the substrate 301. Beneficially, separating the backside channel structure 111 avoids a problem that may occur if the metal were connected, in which case the continuous film would represent a transmission-line mode across the back of the chip. Capacitive coupling from the Josephson junction 105 and leads 103 to a continuous backside film would launch a traveling wave down the backside channel structure, causing resonant coupling to other qubits and dissipation. Breaking up this metal decreases its volume by a small amount, but it breaks up this transmission-line mode. Currents flowing in backside channel structure 111 also give negligible dissipation to the qubit even though they are made of a normal metal. If this dissipation becomes a problem, it is also possible to use a superconducting layer between the substrate 101 and the backside channel structure 111.

Alternatively, the backside channel structure 111 may be made from a lower energy-gap superconductor than the Josephson junction 105 and the leads 102 and 103 of the qubit device, which are normally aluminum. Possible candidates are titanium or an aluminum alloy with about 500-2000 ppm of manganese, which has a transition temperature of 0.2-0.6 Kelvin. These lower gap materials will absorb phonons with energy that could produce quasiparticles in the aluminum Josephson junction 105 and leads 102 and 103, but they will have a high enough energy gap to act as a superconductor to microwave radiation at 5 GHz, producing little dissipation. Since the quasiparticle to phonon scattering rate scales as the cube of the phonon energy, the rate increases significantly if the energy gap of the channel structure 111 is less than about 0.6 of the gap for the qubit structure 105, 102 and 103.

The backside channel structure 111 reduces the density of quasiparticles in the Josephson junction 105 and leads 102 and 103, but these quasiparticles can still be long-lived. As discussed above, these quasiparticles eventually recombine to reduce their density, with the resulting phonon being absorbed by the backside channel structure 111. However, this recombination decay takes about 100 microseconds, a time scale is much longer than the error correction cycle of 1 microsecond, so there will still be correlated errors in time as well as in space across the entire chip. To reduce the density of quasiparticles quickly in the Josephson junction 105 and leads 102 and 103, a topside channel structure 106 and 108 may also be placed on the aluminum wiring 103 and 102.

In one embodiment, the topside channel structure 102 and 103 comprises a lower energy-gap superconductor, as described previously for the backside film 111, and can be made from titanium or an aluminum/manganese alloy. Here, the quasiparticles in the Josephson junction 105 and leads 102 and 103 will diffuse rapidly into the topside channel structure 106 and 108 because of its close proximity, where it will scatter to produce a lower-energy quasiparticle and phonon. This lower energy quasiparticle then cannot reenter the larger gap superconductor of the Josephson junction 105 and leads 102 and 103. The net effect is to channel quasiparticles to the lower-gap superconductor 106 and 108, thus reducing the dissipation of the Josephson junction and giving a longer qubit energy decay time.

Alternatively, it is possible to make the topside channel structure 106 and 108 a normal metal, which can scatter the quasiparticle more quickly. To ensure that the normal metal does not reduce the superconducting gap of the Josephson junction 105 and leads 102 and 103 from the proximity effect, a thin tunnel barrier 110 may be grown on the aluminum film by, for example, ion-mill cleaning and a low-pressure oxidation. For this alternative, it is possible to eliminate the backside channel structure 111 because there is already an upper channel structure 106 and 108, which may take the form of a normal metal film.

FIG. 2 shows two possible designs of the topside channel structure. Here the bare silicon substrate labeled as 201 is an insulator. The ground plane is 102. For the left "single-ended" qubit, the center island lead 103 is connected to the ground plane through the Josephson junction 105. The topside channel 106 is a continuous film on the center island lead 103. For the right "differential" qubit, there are two center island leads 103, which are connected through the Josephson junction 105. The topside channel 106 is now formed by a plurality of pads. The topside channels for the ground plane can be formed by a large continuous film 108, or many smaller films 209, with design as described for channels 106.

Figure 4:
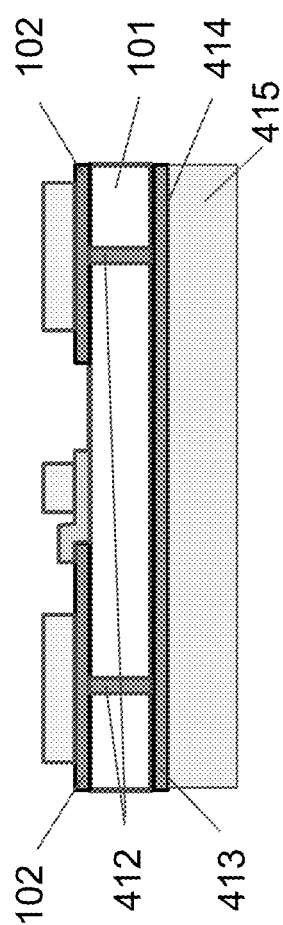
FIG. 4 is a cross-section representation of a quantum processor using vias and a continuous channel structure on the backside of the substrate, according to an embodiment of the invention.

FIG. 4 shows another design that uses through-chip vias 412 through the substrate 101 to connect the topside superconducting ground plane 102 with the backside superconducting ground plane 413. The vias 412 are placed at a distance that is much smaller than the wavelength of the qubit microwaves (e.g., less than about 1 millimeter) so that the traveling-wave transmission line radiation in the superconducting ground plane 413 is shorted out and removed.

Figure 5:
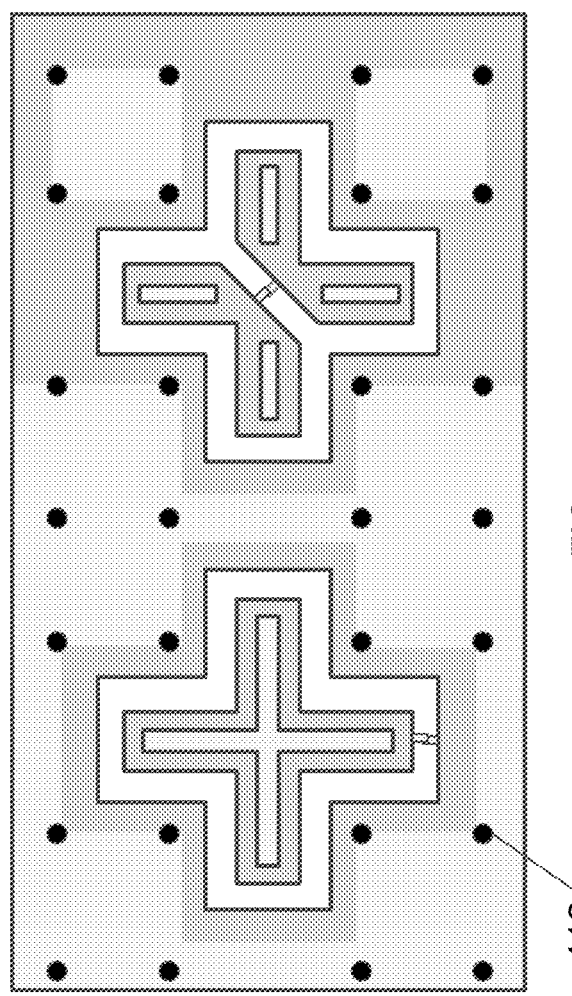
FIG. 5 is a top-view representation of the quantum processor of FIG. 4.

FIG. 5 shows a top view of an array of vias, showing one of the vias 412, e.g., for the processor depicted in FIG. 4. A continuous normal metal 415 is now the backside channeling structure, and is placed over the ground plane 413, as shown in the figure. In another embodiment, the chip is mounted on a channeling structure made from bulk copper metal 415, corresponding to the processor chip mount, allowing phonons to couple from the chip to the metal via a thin interface layer 414, for example made from vacuum grease. This embodiment gives strong coupling of the phonons from the substrate to the bulk copper of the chip mount, which is a temperature bath that cools the qubit processor.

The above embodiments describe channeling structures that are sufficient to channel energy of the muons away from the qubit. They include a normal metal or a lower gap superconductor that have a volume significantly greater than the qubit leads and ground plane, and a normal metal or a lower gap superconductor in connection to the qubit leads.

While this specification contains many specific details of the implementation, these should not limit the scope of any inventions or what may be claimed, but rather as descriptions to features specific to particular embodiments. Certain features described in this specification in the context of specific embodiments can also be implemented in a single embodiment. Conversely, various features that are described in context of a single embodiment can also be implemented in multiple embodiments separately or in any combination. The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure. Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A quantum-computer processor comprising:
a substrate;
a qubit structure formed on the substrate; and
a channel structure comprising at least one of a normal metal and a low energy-gap superconductor, the channel structure coupled to the substrate to channel energy deposited by cosmic-ray muons or other high-energy radiation away from the qubit structure, wherein a ratio of the thickness of the channel structure to the thickness of the qubit structure is at least 1:10.

2. The quantum-computer processor of claim 1, wherein the channel structure is disposed on a side of the substrate opposite the qubit structure.

3. The quantum-computer processor of claim 1, wherein the channel structure is disposed, at least in part, directly over the qubit structure and one or more conductors coupled to the qubit structure.

4. The quantum-computer processor of claim 1, wherein the channel structure is separated into a plurality of disconnected islands.

5. The quantum-computer processor of claim 1, wherein the channel structure comprises a normal metal.

6. The quantum-computer processor of claim 5, wherein the normal metal is copper.

7. The quantum-computer processor of claim 1, wherein the channel structure comprises a low energy-gap superconductor.

8. The quantum-computer processor of claim 1, wherein the channel structure comprises a stack of a superconductor and a normal metal.

9. The quantum-computer processor of claim 1, wherein the qubit structure is a superconducting qubit.

10. The quantum-computer processor of claim 1, wherein the qubit structure comprises a Josephson junction.

11. The quantum-computer processor of claim 10, wherein the channel structure is disposed at least in part over the Josephson junction, where the channel structure comprises at least one of: a lower energy-gap superconductor than used for the qubit structure, a normal metal, a tunnel barrier and normal metal, or a tunnel barrier and a lower energy-gap superconductor than used for the qubit structure.

12. The quantum-computer processor of claim 1, further comprising:
a superconducting ground plane on a side of the substrate opposite to the qubit structure; and
a plurality of superconducting vias connecting the superconducting ground plane to a conductor coupled to the qubit structure.

13. The quantum-computer processor of claim 12, wherein the superconducting ground plane is overlaid using one or more of: a normal metal, a stack of a superconductor and a normal metal, a tunnel barrier and normal metal, a phonon transmissive film and normal metal, or vacuum grease and normal metal.

14. The quantum-computer processor of claim 1, wherein the channel structure has a thickness greater than 1 micrometer.

15. A method for operating a quantum-computer processor, the method comprising:
storing information in a qubit structure of the quantum-computer processor;
subjecting the quantum-computer processor to cosmic-ray muons or other high-energy radiation; and
channeling at least 90% of energy deposited by cosmic-ray muons or other high-energy radiation away from the qubit structure using a channel structure that is coupled to the qubit structure.

16. The method of claim 15, wherein the channel structure is disposed on a side of a substrate opposite the qubit structure.

17. The method of claim 15, wherein the channel structure is disposed, at least in part, directly over the qubit structure and one or more conductors coupled to the qubit structure.

18. The method of claim 15, wherein the channel structure is separated into a plurality of disconnected islands.

19. The method of claim 15, further comprising;
increasing the quasiparticle to phonon scattering rate by using a lower energy-gap superconductor for the channel structure with a transition temperature below 0.6 that of the qubit structure.

20. A quantum-computer processor comprising:
a substrate;
a qubit structure formed on the substrate, wherein the qubit structure comprises a Josephson junction; and
a channel structure comprising at least one of a normal metal and a low energy-gap superconductor, the channel structure coupled to the substrate to channel energy deposited by cosmic-ray muons or other high-energy radiation away from the qubit structure, wherein the channel structure is disposed on a side of the substrate opposite the qubit structure.

* * * * *